United States Patent [19]

Taira et al.

[11] Patent Number: 4,910,399

[45] Date of Patent: Mar. 20, 1990

[54] ELECTRON MICROSCOPE HAVING X-RAY DETECTOR

[75] Inventors: Masayuki Taira; Eiichi Watanabe, both of Tokyo, Japan

[73] Assignee: Jeol Ltd., Tokyo, Japan

[21] Appl. No.: 330,629

[22] Filed: Mar. 30, 1989

[30] Foreign Application Priority Data

Apr. 1, 1988 [JP] Japan .................................. 63-81009

[51] Int. Cl.⁴ .......................................... H01J 37/244
[52] U.S. Cl. ...................................... 250/310; 250/397
[58] Field of Search .............................. 250/310, 397

[56] References Cited

U.S. PATENT DOCUMENTS 3,924,126 12/1975 Anderson et al. .................. 250/311
4,633,085 12/1986 Tomita et al. ...................... 250/310

FOREIGN PATENT DOCUMENTS 55-3129 1/1980 Japan ................................... 250/310

Primary Examiner—Jack I. Berman
Attorney, Agent, or Firm—Webb, Burden, Ziesenheim & Webb

[57] ABSTRACT

There is disclosed an electron microscope having an X-ray detector that detects the X-rays emanating from a specimen placed between the upper and lower magnetic pole pieces of an objective lens in the path of an electron beam. The dimension of the detector taken longitudinally of the gap between the pole pieces is larger than the dimension of the detector taken across the gap. A heat transfer rod is inserted between the gap to cool the detector. The detector is mounted to the rod. There is also disclosed an electron microscope having an X-ray detector mounted on the side surface of a heat transfer rod which faces the path of an electron beam. The rod extends along a straight line that runs substantially perpendicular to the path remotely from the path.

6 Claims, 2 Drawing Sheets

ELECTRON MICROSCOPE HAVING X-RAY DETECTOR

BACKGROUND OF THE INVENTION

The present invention relates to an electron microscope having an X-ray detector for detecting the X-rays produced from a specimen and, more particularly, to an electron microscope having the above-described X-ray detector inserted between the upper and lower magnetic pole pieces of the objective lens.

In transmission electron microscope, a specimen is placed between the upper and lower magnetic pole pieces in the electron beam path. Where an elemental analysis of the specimen is made, an X-ray spectrometer is added to detect and analyze the X-rays emitted by the specimen in response to the incident electron beam.

X-ray spectrometers are classified into two major categories: (1) wavelength-dispersive spectrometer which uses a diffracting crystal to disperse and analyze the X-rays coming from a specimen and (2) energy-dispersive spectrometer consisting of a semiconductor detector detecting the X-rays emanating from a specimen and a pulse height analyzer that analyzes the amplitudes of the output pulses from the semiconductor detector.

An electron microscope equipped with such an energy-dispersive spectrometer is disclosed in, for example, U.S. Pat. No. 3,924,126. FIG. 1 is a cross-sectional view of an electron microscope having an energy dispersive spectrometer. FIG. 2 is a cross-sectional view taken on line A-A of FIG. In both Figs. 1 and 2, a specimen 4 is disposed on the axis Z of an electron beam between the upper magnetic pole piece 2 and the lower magnetic pole piece 3 of an objective lens. The electron beam falls on the specimen 4 at a point 0. Characteristic X-rays X emerging from the point 0 enter a circular semiconductor detector 5 and are detected. The detector 5 is mounted in the space between the pole pieces 2 and 3 in an opposite relation to the point 0. The detector 5 is mounted on the front end surface of a heat transfer rod 6 which extends through a known airlock mechanism 12 into the microscope, the mechanism 12 being mounted on the outer wall 1. The other end of the rod 6 is located inside a cooling vessel 8 filled with liquid nitrogen, for example. Thus, the detector 5 is kept at a low temperature. The detector 5 and the heat transfer rod 6 are surrounded by a cylinder 9 whose on end is situated inside a vacuum chamber 10 in which the cooling vessel 8 is housed. The front end of the cylinder 9 is sealed off by a material transmitting X-rays, such as a beryllium thin film 11, to maintain the inside of both vacuum chamber 10 and cylinder 9 as a vacuum.

In order to detect the characteristic X-rays emitted from the specimen 4 by the detector 5 with improved sensitivity, it is necessary to (a) increase the area of the incident surface of the detector 5 and to (b) place the detector 5 as close to the specimen 4 as possible.

In the known instrument as shown in FIG. 1 in order to bring the detector 5 close to the specimen for enhancing the sensitivity, it is required to decrease the diameters of the detector 5, the heat transfer rod 6, and the cylinder 9. Unfortunately, this leads to a reduction in the sensitivity.

If the diameter of the detector 5 is increase to increase the area, then it is necessary to place the cylinder 9 remotely from the specimen 4 to prevent the magnetic pole pieces 2 and 3 from coming into contact with the cylinder 9. However, this results in a decrease in the sensitivity.

FIG. 3 shows a conventional system in which the x-rays emanating from a specimen held horizontally are detected. It is important for this system that (c) the take-off angle α of X-rays be large, as well as the fulfillment of the aforementioned conditions (a) and (b), to enhance the sensitivity.

To satisfy the condition (c), the detector 5 and the cylinder 9 are placed close to the inclined surfaces of the detector 5. Placing the detector 5 closer to the specimen requires that the detector 5, the heat transfer rod 6, and the cylinder 9 have less diameters as indicated by the broken line a, which causes a reduction in the sensitivity.

If the diameter of the detector 5 is increased, the cylinder 9 must be positioned remotely from the specimen 4 to prevent the upper magnetic pole piece 2 from contacting the cylinder 9 as indicated by the broken line b. This leads to a decrease in the sensitivity. In this way, the conventional devices where a circular detector is mounted at the front end of a heat transfer rod are unable to offer sufficiently high sensitivity.

SUMMARY OF THE INVENTION

It is an object of the invention to provide an electron microscope using an X-ray detector extending longitudinally of the gap between two magnetic pole pieces to provide improved sensitivity.

It is another object of the invention to provide an electron microscope having an X-ray detector mounted on the surface of a heat transfer rod which faces the electron beam path, for detecting X-rays with improved sensitivity.

Briefly, according to this invention, there is provided an electron microscope having an X-ray detector for detecting the X-rays emanating from a specimen that is placed between the upper and lower magnetic pole pieces of an objective lens in the path of an electron beam. The detector has an X-ray sensitive face for which the dimension of the detector taken longitudinally of the gap between the magnetic pole pieces is larger than the dimension of the detector taken perpendicular to the longitudinal direction of the gap. The electron microscope further includes a heat transfer rod for cooling the detector. The rod is inserted between the magnetic pole pieces. The detector is mounted to the rod.

According to one embodiment of the invention, a heat transfer rod is disposed between the upper and lower magnetic pole pieces of an objective lens. The rod is disposed along a straight line which runs substantially perpendicular to the path of an electron beam remotely from the path. An X-ray detector is mounted on the side surface of the rod which faces a specimen.

According to another embodiment of the invention, a heat transfer rod is mounted between th upper and lower magnetic pole pieces of an objective lens and disposed such that its front end surface faces a specimen. An X-ray detector extending longitudinally of the gap between the magnetic pole pieces is mounted on the front end surface.

DESCRIPTION OF THE PREFERRED EMBODIMENTS

Figure 4:
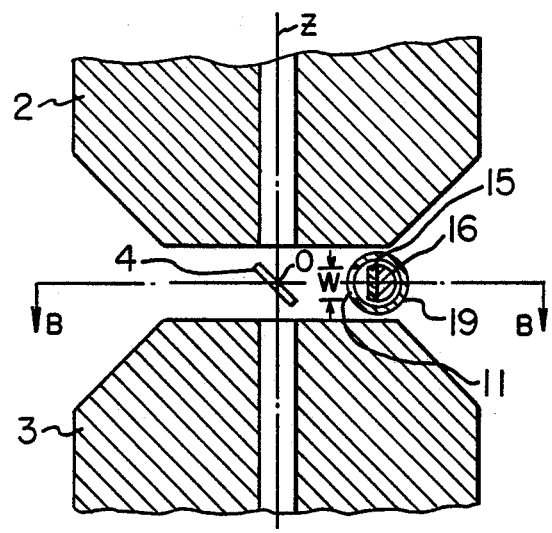
FIG. 4 is a cross-sectional view of an electron microscope according to the invention.
Figure 5:
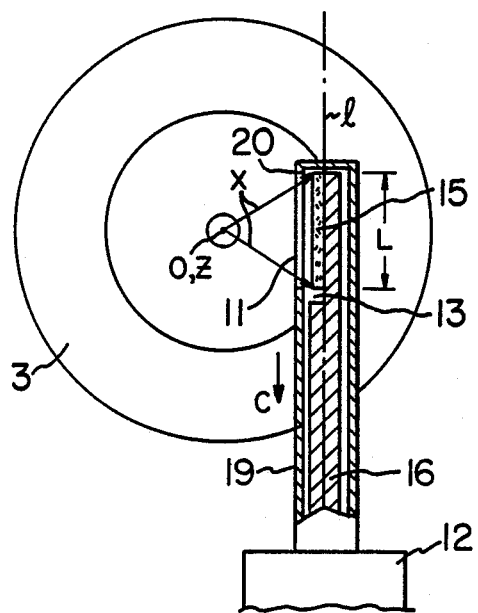
FIG. 5 is a cross-sectional view taken on line B—B of FIG. 4.

Referring to FIGS. 4 and 5, there is shown an electron microscope embodying the present invention. This microscope includes an objective lens having an upper magnetic pole piece 2 and a lower magnetic pole piece 3. A specimen 4 is placed between the pole pieces 2 and 3 on the axis Z of an electron beam. A heat transfer rod 16 is inserted between the pole pieces 2 and 3 along a straight line ( which runs substantially perpendicular to the axis Z and does not cross the axis Z. A notch 13 facing the specimen 4 is formed in the outer surface of the transfer rod 16 near the front end of the rod. A semiconductor detector 15 is mounted in the notch 13 such that its incident surface faces the specimen 4.

Figure 1:
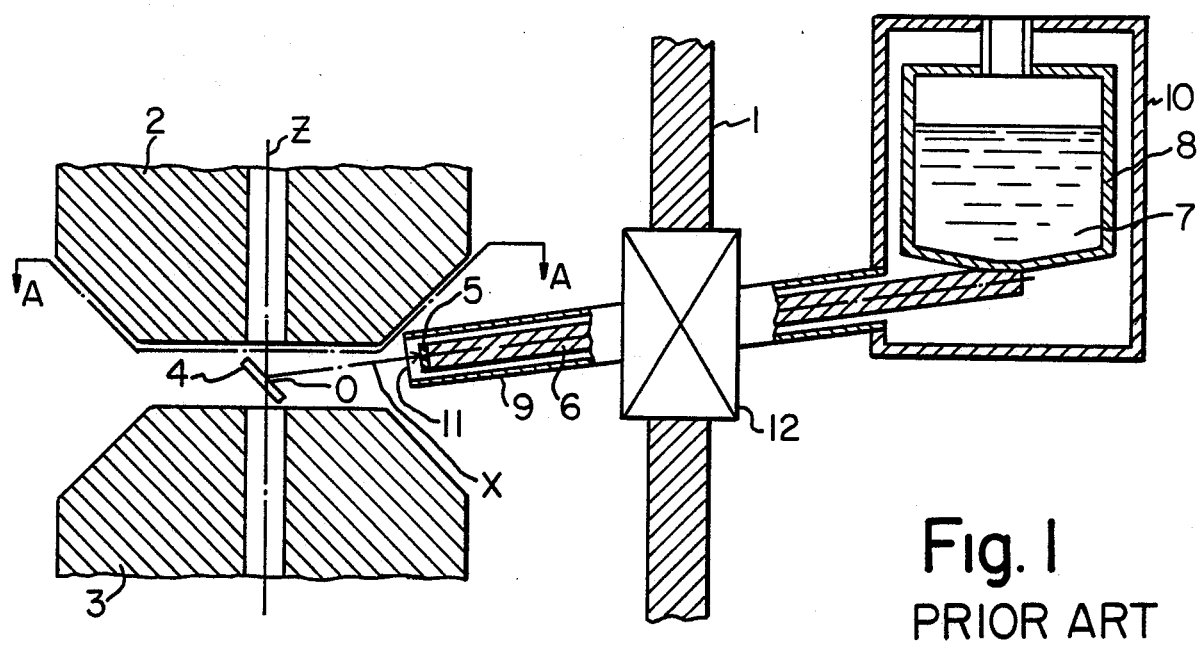
FIG. 1 is a cross-sectional view of a known electron microscope equipped with an energy-dispersive spectrometer.
Figure 2:
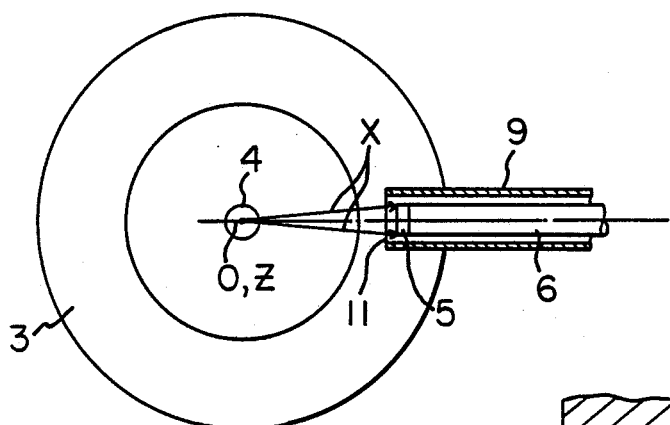
FIG. 2 is a cross-sectional view taken on line A—A of FIG. 1.
Figure 3:
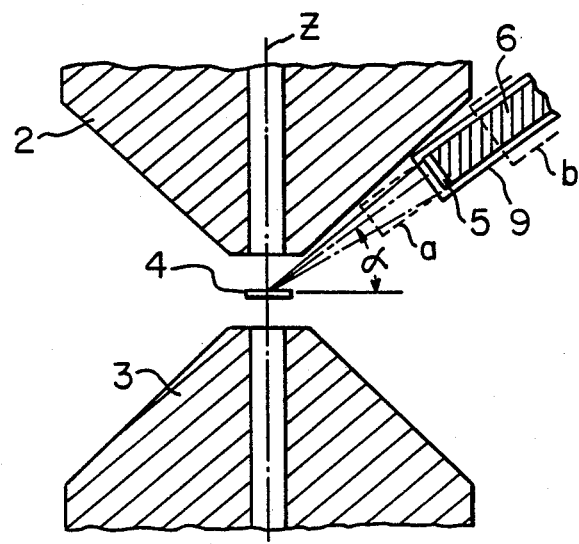
FIG. 3 is a cross-sectional view of a conventional X-ray detection system in which the X-rays emanating from a specimen held horizontally are detected.

A cylinder 19 which surrounds the heat transfer rod 16 has a bottom. A window 20 is formed in the side surface of the cylinder 19 to permit the X-rays coming from the specimen to reach the detector 15. A thin film 11 made from beryllium extends across the window 20. The rod 16 and the cylinder 19 extend through an airlock mechanism 12 and reach into a cooling vessel and vacuum chamber, none of which are shown, in the same manner as in the instrument shown in FIG. 1. The detector 15, the heat transfer rod 16, and the cylinder 19 can be pulled out of the electron microscope through the airlock mechanism 12 by moving them rearward, or in the direction indicated by the arrow C.

In the above-described structure, the detector 15 mounted on the side surface of the heat transfer rod 16 is rectangular or elliptic in shape. The width W of the detector is set sufficiently less than the space between the magnetic pole pieces. The detector 15 has a length L longitudinally of the pole piece gap. The length L is set larger than the width W. Since the detector 15 takes a rectangular or elliptic form, the diameters of the cylinder 19 and the rod 16 can be made smaller than the diameters of the conventional counterparts shown in FIG. 1. Further, by making the length L of the detector 15 sufficiently large, the area of the incident surface can be made equal to or eve larger than the area of the incident surface of the detector shown in FIG. 1. A reduction in the diameter of the cylinder 19 enables the detector 15 to be placed closer to the specimen as shown in FIG. 4. In this way, in the novel instrument, the detector whose incident area is equal to or greater than the prior art incident area can be disposed closer to the specimen than conventional. Hence, the sensitivity at which X-rays are detected are enhanced greatly. If the distance to the specimen is equal to the distance employed heretofore, the length L can be made sufficiently large to render the incident area of the detector larger than conventional. Consequently, the sensitivity can be improved. A reduction in the diameter of the cylinder 19 simplifies the vacuum seal, which makes the X-ray spectrometer smaller.

Figure 6:
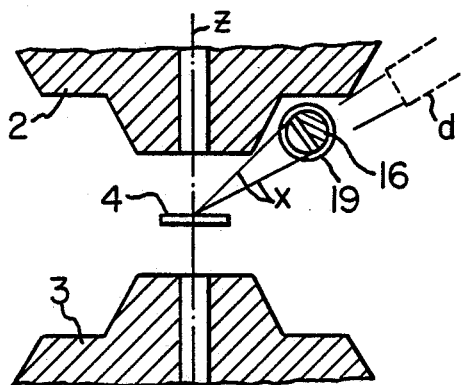
FIG. 6 is a cross-sectional view of another electron microscope according to the invention.

FIG. 6 is a cross-sectional view of another electron microscope according to the invention. This microscope is similar to the microscope shown in FIGS. 4 and 5 except that the inclined surfaces of the magnetic pole pieces 2 and 3 have steps. The heat transfer rod 16 having the detector 15 mounted on the side surface of the rod is disposed on one of the steps.

In the conventional structure where the circular detector is mounted to one end surface of the heat transfer rod, the detector cannot be placed closer to the specimen than the position d indicted by the broken line in FIG. 6. In the novel configuration, the heat transfer rod 16 to which the detector 15 is mounted is inserted along the straight line L which does not intersect the axis Z and extends substantially at right angles to the axis Z. This allows the detector to be placed closer to the specimen. The detector 15 can be circular in shape in the same way as the prior art detector. Also, the detector can be made identical in area with the prior art deteetor. Where the detector 15 is shaped into a rectangular or elliptic form, the area of the incident surface can be increased as compared with the area of the prior art incident surface. This further enhances the sensitivity.

Figure 7:
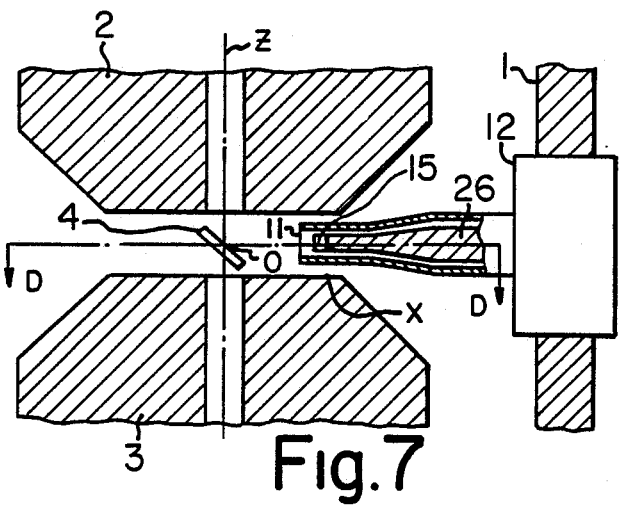
FIG. 7 is a cross-sectional view of a further electron microscope according to the invention.
Figure 8:
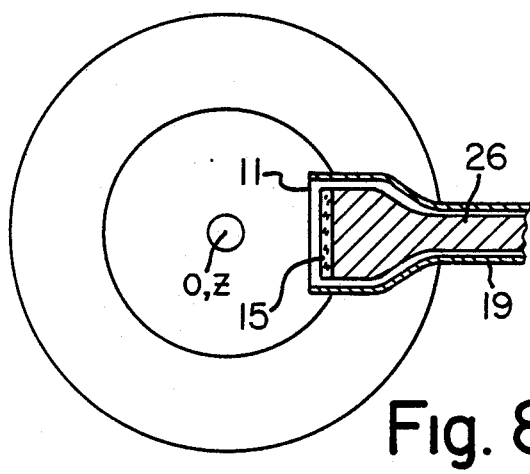
FIG. 8 is a cross-sectional view taken on line D—D of FIG. 7.

FIG. 7 is a cross-sectional view of a further electron microscope according to the invention. FIG. 8 is a cross-sectional view taken on line D—D of FIG. 7. In this example, a heat transfer rod 26 is inserted into the microscope through an airlock valve 12 in such a way that the front end surface of the rod 26 faces the axis Z of an electron beam. The front end of the rod 26 is so machined that its cross section assumes an elliptic or rectangular form. An elliptic or rectangular detector 15 is mounted on the front end surface o the rod. Also in this example, the area of the incident surface of the detector is equal to or larger than the area of the prior art detector surface. Since this detector can be placed closer to the specimen, the sensitivity can be enhanced greatly.

While the invention has been described in its preferred embodiments, such description is for illustrative purposes only, and it is to be understood that numerous changes and variations may be made without departing from the spirit and scope of the invention. As an example, it is not always necessary that the aforementioned window be sealed off by a thin film. Also, a detector may be mounted to a heat transfer rod without forming the notch 13.

Having thus described our invention with the detail and particularity required by the Patent Laws, what is claimed and desired to be protected by Letters Patent is set forth in the following claims.

What is claimed is:

1. An electron microscope having an X-ray detector for detecting the X-rays emanating from a specimen that is placed between the upper and lower magnetic pole pieces of an objective lens in the path of an electron beam, the dimension of the detector which is taken longitudinally of the gap between the magnetic pole pieces being larger than the dimension of the detector taken perpendicular to the longitudinal direction of the gap, the electron microscope further including a heat transfer rod for cooling the detector, the rod being inserted between the magnetic pole pieces, the detector being mounted to the rod.

2. An electron microscope having an X-ray detector as set forth in claim wherein said heat transfer rod is inserted between the magnetic pole pieces in such a way that the front end surface of the rod faces the specimen, and wherein said detector is mounted on the front end surface of the rod.

3. An electron microscope having an X-ray detector as set forth in claim 1, wherein said heat transfer rod extends along a straight line which runs substantially perpendicular to the path of the electron beam remotely from the path, and wherein said detector is mounted to the side surface of the rod that faces the path of the beam.

4. An electron microscope comprising:
   an objective lens consisting of an upper magnetic pole piece and a lower magnetic pole piece;
   an X-ray detector for detecting the X-rays emanating from a specimen which is placed between the magnetic pole pieces in the path of an electron beam;
   a heat transfer rod disposed between the magnetic pole pieces and extending along a straight line which runs substantially perpendicular to the path of the beam remotely from the path, the X-ray detector being mounted on the side surface of the heat transfer rod which faces the path of the beam, the detector being cooled through the rod;
   a cylinder which surrounds the heat transfer rod and the detector such that the cylinder is kept off both of the rod and the detector; and
   a window formed in the cylinder to permit the X-rays emanating from the specimen to fall on the detector.

5. An electron microscope as set forth in claim 4, wherein the X-ray detector is so shaped that the dimension of the detector taken longitudinally of the gap between the magnetic pole pieces is larger than the dimension of the detector taken perpendicular to the longitudinal direction.

6. An electron microscope as set forth in claim 4, wherein the X-ray detector is circular in shape.

* * * * *

UNITED STATES PATENT AND TRADEMARK OFFICE
CERTIFICATE OF CORRECTION

PATENT NO. : 4,910,399

DATED : March 20, 1990

INVENTOR(S) : Masayuki Taira and Eiichi Watanabe

It is certified that error appears in the above-identified patent and that said Letters Patent is hereby corrected as shown below:

Column 1 Line 12 after "In" insert --a--.

Column 1 Line 30 "energy dispersive" should read --energy-dispersive--.

Column 1 Line 32 after "FIG." insert --1.--.

Column 1 Line 32 "Figs." should read --FIGS.--.

Column 1 Line 48 "on" should read --one--.

Column 1 Line 65 "increase" (first occurrence) should read --increased--.

Column 2 Line 4 "x" should read --X--.

Column 2 Line 6 "∞of" should read --$\alpha$ of--.

Column 2 Line 58 "th" should read --the--.

Column 3 Line 26 "(" should read -- &--.

UNITED STATES PATENT AND TRADEMARK OFFICE
CERTIFICATE OF CORRECTION

PATENT NO. : 4,910,399

DATED : March 20, 1990

INVENTOR(S) : Masayuki Taira and Eiichi Watanabe

It is certified that error appears in the above-identified patent and that said Letters Patent is hereby corrected as shown below:

Column 3 Line 38 after "and" (second occurrence) insert --a--.

Column 3 Line 57 "eve" should read --even--.

Column 4 Line 18 "L" should read -- $\ell$ --.

Column 4 Line 37 "o" should read --of--.

Claim 2 Line 4 Column 5 after "claim" insert --1,--.

Signed and Sealed this

Twenty-eighth Day of May, 1991

*Attest:*

HARRY F. MANBECK, JR.

*Attesting Officer*     *Commissioner of Patents and Trademarks*